(12) United States Patent
Park et al.

(10) Patent No.: US 9,852,997 B2
(45) Date of Patent: Dec. 26, 2017

(54) HYBRID WAFER DICING APPROACH USING A ROTATING BEAM LASER SCRIBING PROCESS AND PLASMA ETCH PROCESS

(71) Applicant: APPLIED MATERIALS, INC., Santa Clara, CA (US)

(72) Inventors: Jungrae Park, Santa Clara, CA (US); Wei-Sheng Lei, San Jose, CA (US); James S. Papanu, San Rafael, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/081,296

(22) Filed: Mar. 25, 2016

(65) Prior Publication Data
US 2017/0278801 A1    Sep. 28, 2017

(51) Int. Cl.
*H01L 21/00* (2006.01)
*H01L 23/544* (2006.01)
(Continued)

(52) U.S. Cl.
CPC .......... *H01L 23/544* (2013.01); *B23K 26/064* (2015.10); *B23K 26/359* (2015.10);
(Continued)

(58) Field of Classification Search
CPC .. H01L 21/78; H01L 21/3065; H01L 2224/94
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Jaehwan Oh
(74) *Attorney, Agent, or Firm* — Schwabe, Williamson & Wyatt, P.C.

(57) ABSTRACT

Methods of dicing semiconductor wafers, each wafer having a plurality of integrated circuits, are described. In an example, a method of dicing a semiconductor wafer having a plurality of integrated circuits involves forming a mask above the semiconductor wafer, the mask composed of a layer covering and protecting the integrated circuits. The mask is then patterned with a rotating laser beam laser scribing process to provide a patterned mask with gaps, exposing regions of the semiconductor wafer between the integrated circuits. The semiconductor wafer is then plasma etched through the gaps in the patterned mask to singulate the integrated circuits.

12 Claims, 11 Drawing Sheets

(51) Int. Cl.
  *H01L 21/78* (2006.01)
  *B23K 26/359* (2014.01)
  *B23K 26/064* (2014.01)
  *B23K 26/364* (2014.01)

(52) U.S. Cl.
  CPC .......... *B23K 26/364* (2015.10); *H01L 21/78* (2013.01); *H01L 2223/5446* (2013.01)

(56) References Cited

U.S. PATENT DOCUMENTS

| | | | |
|---|---|---|---|
| 4,684,437 | A | 8/1987 | Donelon et al. |
| 5,336,638 | A | 8/1994 | Suzuki et al. |
| 5,593,606 | A | 1/1997 | Owen et al. |
| 5,691,794 | A | 11/1997 | Hoshi et al. |
| 6,051,503 | A | 4/2000 | Bhardwaj et al. |
| 6,057,180 | A | 5/2000 | Sun et al. |
| 6,174,271 | B1 | 1/2001 | Kosmowski |
| 6,300,593 | B1 | 10/2001 | Powell |
| 6,306,731 | B1 | 10/2001 | Igarashi et al. |
| 6,407,363 | B2 | 6/2002 | Dunsky et al. |
| 6,426,275 | B1 | 7/2002 | Arisa |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 8,883,615 | B1 * | 11/2014 | Holden ............ H01J 37/32009 257/723 |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2007/0102404 | A1 | 5/2007 | Hertzberg |
| 2009/0004780 | A1 | 1/2009 | Arita et al. |
| 2009/0255911 | A1 | 10/2009 | Krishnaswami et al. |
| 2010/0013036 | A1 | 1/2010 | Carey |
| 2010/0064538 | A1 * | 3/2010 | Scarsbrook ........ B23K 26/0075 33/559 |
| 2010/0120113 | A1 * | 5/2010 | Mohanty ................ C12M 35/02 435/173.1 |
| 2010/0216313 | A1 | 8/2010 | Iwai et al. |
| 2010/0248451 | A1 | 9/2010 | Pirogovsky et al. |
| 2010/0303416 | A1 * | 12/2010 | Danley .................... G02B 6/25 385/55 |
| 2011/0014777 | A1 | 1/2011 | Haji et al. |
| 2011/0312157 | A1 | 12/2011 | Lei et al. |
| 2012/0175353 | A1 | 7/2012 | Birnesser et al. |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |
| 2014/0120698 | A1 | 5/2014 | Lei et al. |
| 2015/0140241 | A1 * | 5/2015 | Hosseini ............ B23K 26/0617 428/34.4 |
| 2015/0217401 | A1 | 8/2015 | Holdern et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

Applied Materials, Inc., "International Search Report and Written Opinion", PCT Application No. PCT/US2017/023903, (Jul. 4, 2017).

* cited by examiner

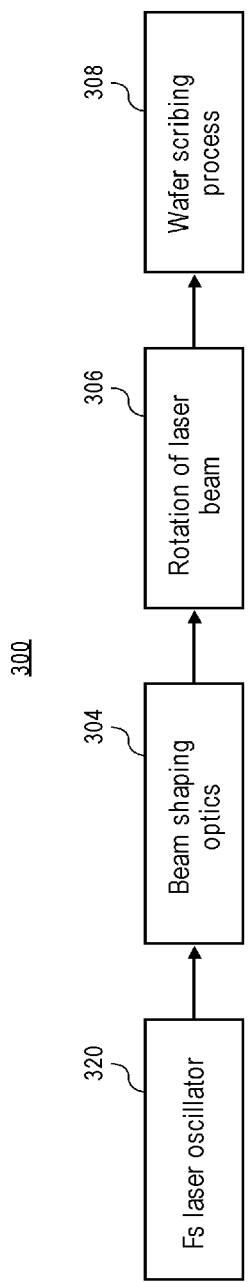
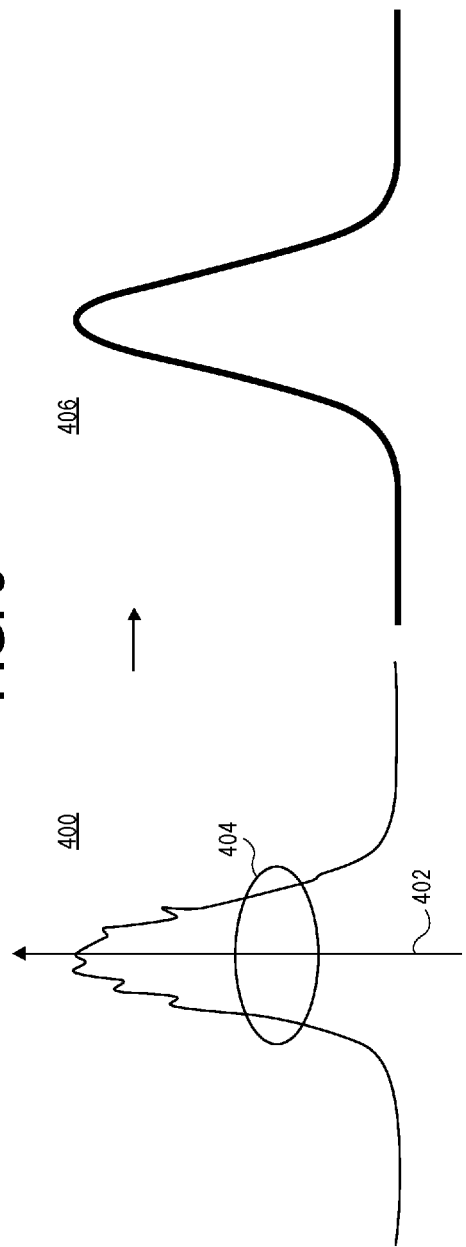

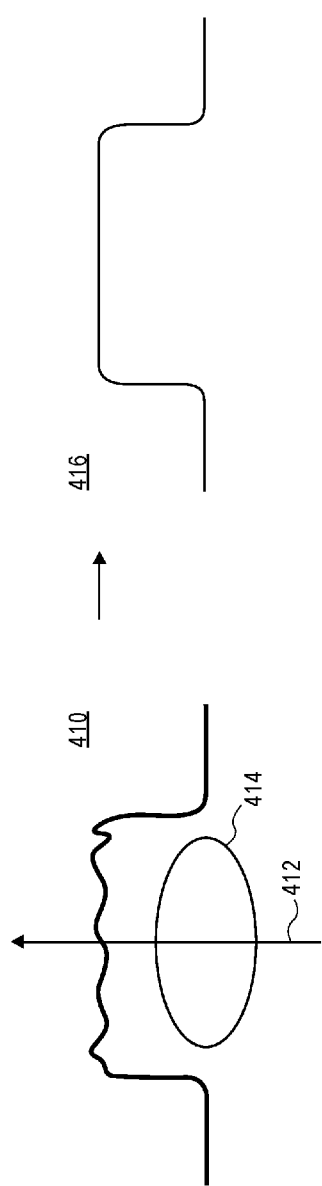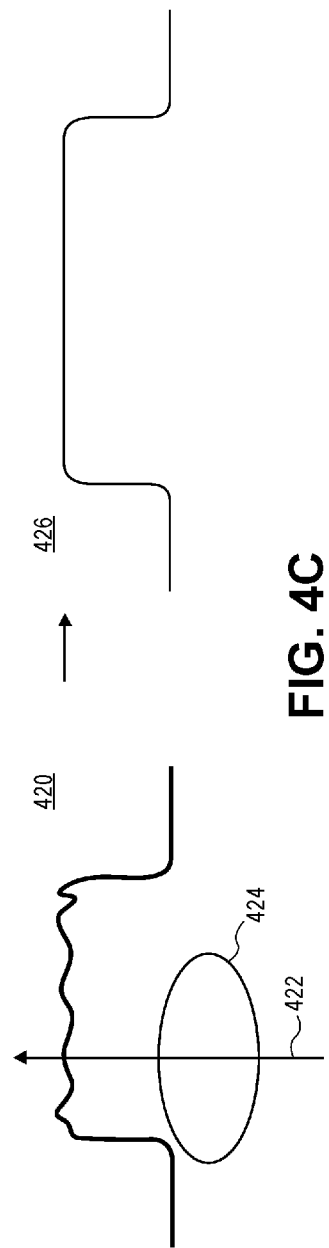

HYBRID WAFER DICING APPROACH USING A ROTATING BEAM LASER SCRIBING PROCESS AND PLASMA ETCH PROCESS

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110>direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of, and apparatuses for, dicing semiconductor wafers.

In an embodiment, a method of dicing a semiconductor wafer having a plurality of integrated circuits involves forming a mask above the semiconductor wafer, the mask composed of a layer covering and protecting the integrated circuits. The mask is then patterned with a rotating beam laser scribing process to provide a patterned mask with gaps, exposing regions of the semiconductor wafer between the integrated circuits. The semiconductor wafer is then plasma etched through the gaps in the patterned mask to singulate the integrated circuits.

In another embodiment, a method of dicing a semiconductor wafer including a plurality of integrated circuits involves laser scribing the semiconductor wafer with a rotating beam laser scribing process to singulate the integrated circuits.

In another embodiment, a system for dicing a semiconductor wafer having a plurality of integrated circuits includes a factory interface. The system also includes a laser scribe apparatus coupled with the factory interface and having a laser assembly configured to provide a rotating laser beam. The system also includes a plasma etch chamber coupled with the factory interface.

BRIEF DESCRIPTION OF THE DRAWINGS

FIG. 3 is a flowchart representing operations of a laser scribing process with a rotating beam, in accordance with an embodiment of the present invention.

FIG. 4A illustrates the effect of rotating a Gaussian beam on-axis of the Gaussian beam, in accordance with an embodiment of the present invention.

FIG. 4B illustrates the effect of rotating a line-shaped beam having a flat top on-axis of the beam, in accordance with an embodiment of the present invention.

FIG. 4C illustrates the effect of rotating a line-shaped beam having a flat top off-axis of the beam, in accordance with an embodiment of the present invention.

DETAILED DESCRIPTION

Figure 1:
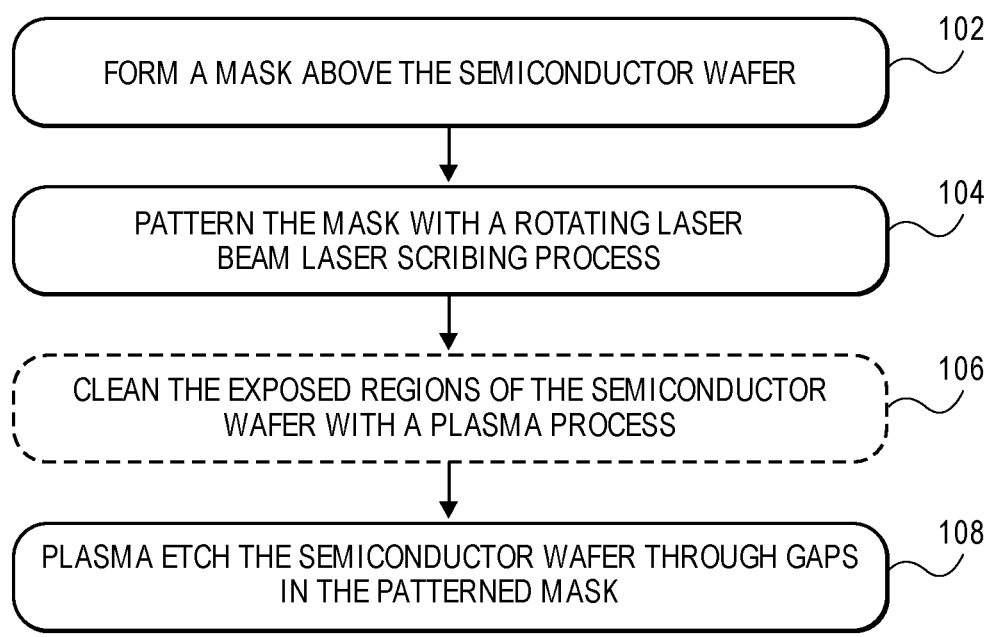
FIG. 1 is a Flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as rotating beam laser scribing approaches and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. More specifically, one or more embodiments are directed to implementing a rotating beam laser scribing process for, e.g., dicing applications.

Spatially uniform laser pulses by laser beam rotation for improved laser scribing process in hybrid laser dicing are described. Embodiments include rotation of a beam as provided from a source, or rotation of an already shape laser beam. Advantages for rotating beam scribing may involve, in a first embodiment, improving a process based on a lousy beam profile by providing an improved clean flat top beam profile and to achieve a scribed clean trench on the wafer. In another embodiment, a dicing process based on an input lousy Gaussian laser beam profile is advantageously improved by converting the beam into a clean Gaussian beam profile using concentric rotation.

To provide context, in a hybrid wafer or substrate dicing process involving an initial laser scribe and subsequent plasma etch of a coated wafer, a femtosecond laser may be applied to remove the mask and device layers on the dicing street until the silicon substrate is exposed. A plasma etch follows to separate dies to realize die singulation. Typically, a non-rotated beam is used for the scribing process. However, a non-rotated beam may shows its limitation with the following two different situations: (1) when a smooth sidewall is needed for a typical narrow kerf width or (2) when a wide kerf is demanded.

In accordance with one or more embodiments of the present invention, a scribing laser beam is rotated for improving laser scribing process in hybrid laser dicing. In additional embodiments, rotating of spatially shaped beams is implemented for improving laser scribing process in hybrid laser dicing processing schemes. In an embodiment, rotation of the beam is performed at a rotation rate approximately in the range of 120 to 1200 rotations per minute (RPM). In one such embodiment, a lower limit is set as approximately 120 RPM to achieve a desired effect, e.g., beam smoothing. In one embodiment, an upper limit is set based on reliability of rotation optics, e.g., in terms of vibration.

Figure 2A:
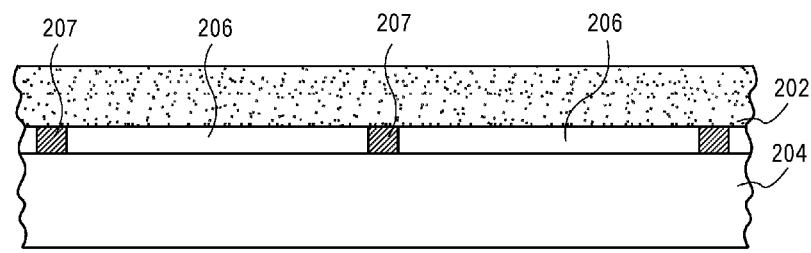
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
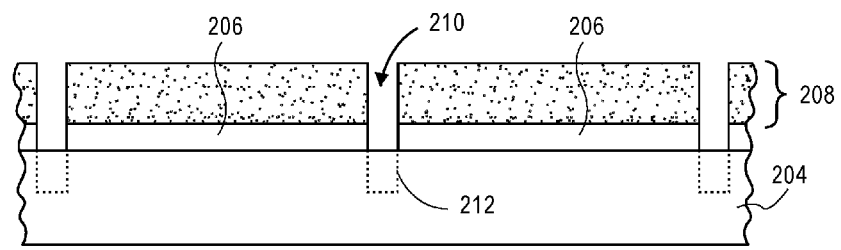
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
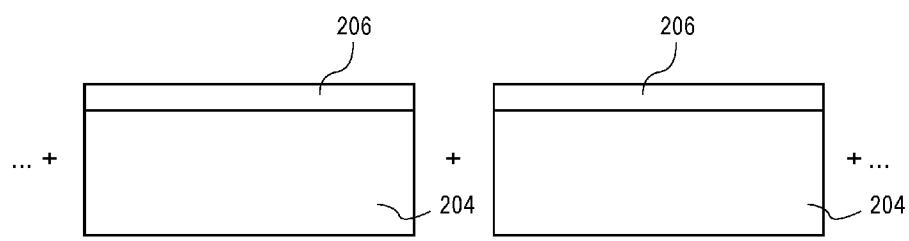
FIG. 2C illustrates a cross-sectional view of a semiconductor wafer including a plurality of integrated circuits during performing of a method of dicing the semiconductor wafer, corresponding to operation 108 of the Flowchart of FIG. 1, in accordance with an embodiment of the present invention.

As such, in an aspect of the present invention, a combination of a rotating beam laser scribing process with a plasma etching process may be used to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 is composed of a layer covering and protecting integrated circuits 206 formed on the surface of semiconductor wafer 204. The mask 202 also covers intervening streets 207 formed between each of the integrated circuits 206.

In accordance with an embodiment of the present invention, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 202 involves forming a layer deposited in a plasma deposition process. For example, in one such embodiment, the mask 202 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 202 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 202 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a rotating laser beam laser scribing process to provide a patterned mask 208 with gaps 210, exposing regions of the semiconductor wafer or substrate 204 between the integrated circuits 206. In one such embodiment, the mask 202 is patterned with a rotating shaped laser beam laser scribing process to provide the patterned mask 208 with gaps 210. As such, the laser scribing process is used to remove the material of the streets 207 originally formed between the integrated circuits 206. In accordance with an embodiment of the present invention, patterning the mask 202 with the rotating laser beam laser scribing process includes forming trenches 212 partially into the regions of the semiconductor wafer 204 between the integrated circuits 206, as depicted in FIG. 2B.

FIG. 3 is a flowchart 300 representing operations of a laser scribing process with a rotating beam, in accordance with an embodiment of the present invention. Referring to FIG. 3, at operation 302, a laser beam is input to or generated from a femto-second (Fs) laser oscillator. At operation 304, in an optional embodiment, the beam is then passed beam shaping optics. At operation 306, the beam obtained directly from operation 302, or the beam obtained from operation 304, is rotated. At operation 308, the output rotating beam from operation 306 is used in a wafer scribing process. Thus, a laser scribing process with rotation of a laser beam may be implemented. In an embodiment, for scribing trench size control, the beam shaping operation 304 is implemented in the rotating beam process scheme.

In a first example of beam rotation, FIG. 4A illustrates the effect of rotating a Gaussian beam on-axis of the Gaussian beam, in accordance with an embodiment of the present invention. Referring to FIG. 4A, an input Gaussian beam 400 having a central axis 402 has a relatively rough profile. The input Gaussian beam 400 is rotated around axis 402 in direction 404 to provide a relatively smoother Gaussian output beam 406. Thus, in an embodiment, an input lousy Gaussian laser beam profile is converted into a clean Gaussian beam profile by concentric rotation.

In a second example of beam rotation, FIG. 4B illustrates the effect of rotating a line-shaped beam having a flat top on-axis of the beam, in accordance with an embodiment of the present invention. Referring to FIG. 4B, an input line-shaped beam 410 having a flat top and having a central axis 412 has a relatively rough profile. The input line-shaped beam 410 having the flat top is rotated around axis 412 in direction 414 to provide a relatively smoother input line-shaped beam 416 having a flat top. Thus, in an embodiment, a lousy beam profile provided after shaping is subsequently improved to the clean flat top beam profile and is used in a laser scribing process to provide a scribed clean trench on the wafer. In one embodiment, the input line-shaped beam 410 having the flat top is first obtained by inputting a Gaussian beam profile into shaping optics to provide a line shaped flat top profile output from the beam shaping optics. In a specific embodiment, the beam shaping optics includes a diffractive optical element, one or more slit aperture, axicons, etc.

In a third example of beam rotation, FIG. 4C illustrates the effect of rotating a line-shaped beam having a flat top off-axis of the beam, in accordance with an embodiment of the present invention. Referring to FIG. 4C, an input line-shaped beam 420 having a flat top and having an off-set axis 422 has a relatively rough profile. The input line-shaped beam 420 having the flat top is rotated around off-set axis 422 in direction 424 to provide a relatively smoother input line-shaped beam 426 having a flat top. However, in one embodiment, since the rotation was performed off-center, the resulting profile has a larger dimension than beam 416 of FIG. 4B. In one embodiment, using off-centered shifted rotation controls the scribed trench size and provides for process variety for selecting from various scribing schemes on a same wafer.

Thus, referring again to FIG. 4C, in an embodiment, a lousy beam profile provided after shaping is subsequently improved to the clean flat top beam profile and is used in a laser scribing process to provide a scribed clean trench on the wafer. In one embodiment, the input line-shaped beam 420 having the flat top is first obtained by inputting a Gaussian beam profile into shaping optics to provide a line shaped flat top profile output from the beam shaping optics. In a specific embodiment, the beam shaping optics includes a diffractive optical element, one or more slit aperture, axicons, etc.

In an aspect, a high laser pulse repetition process may be required for achieving high through-put of a laser application. To match the process requirements, high speed control of rotated pulsed laser beam may thus be needed. In an embodiment, using an electro-static/dynamic motor, a light pipe is inserted into the motor core to effect beam rotation, examples of which are described below in association with FIGS. 5A and 5B.

Figure 5B:
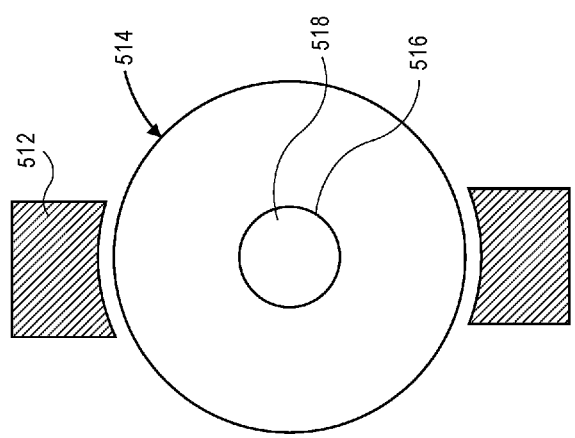
FIG. 5B illustrates a schematic of a motor having a rotor with a core where rotating laser beam is output from a cylindrical light pipe housed in the core of the rotor, in accordance with an embodiment of the present invention.
Figure 5A:
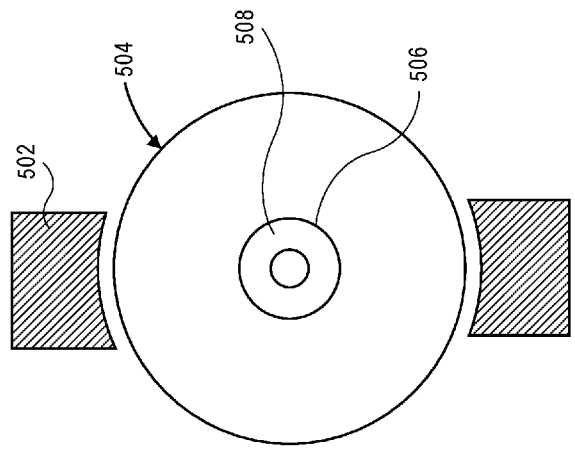
FIG. 5A illustrates a schematic of a motor having a rotor with a core where rotating laser beam is output from a tubular light pipe housed in the core of the rotor, in accordance with an embodiment of the present invention.

In a first example, FIG. 5A illustrates a schematic of a motor having a rotor with a core where rotating laser beam is output from a tubular light pipe housed in the core of the rotor, in accordance with an embodiment of the present invention. A laser assembly includes a motor 502 having a rotor 504 with a core 506. A rotating laser beam is output from a tubular light pipe 508 housed in the core 506 of the rotor 504. In an embodiment, a tubular light pipe 508 is a light pipe having an annular shape with a hollow center, as is depicted in FIG. 5A.

In a second example, FIG. 5B illustrates a schematic of a motor having a rotor with a core where rotating laser beam is output from a cylindrical light pipe housed in the core of the rotor, in accordance with an embodiment of the present invention. A laser assembly includes a motor 512 having a rotor 514 with a core 516. A rotating laser beam is output from a cylindrical light pipe 518 housed in the core 516 of the rotor 514. In an embodiment, a cylindrical light pipe 518 is a light pipe having a solid center, as is depicted in FIG. 5B.

In an embodiment, a femtosecond-based laser is used as a source for a rotating laser beam or rotating shaped laser beam scribing process. For example, in an embodiment, a laser with a wavelength in the visible spectrum plus the ultra-violet (UV) and infra-red (IR) ranges (totaling a broadband optical spectrum) is used to provide a femtosecond-based laser pulse, which has a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Figure 6:
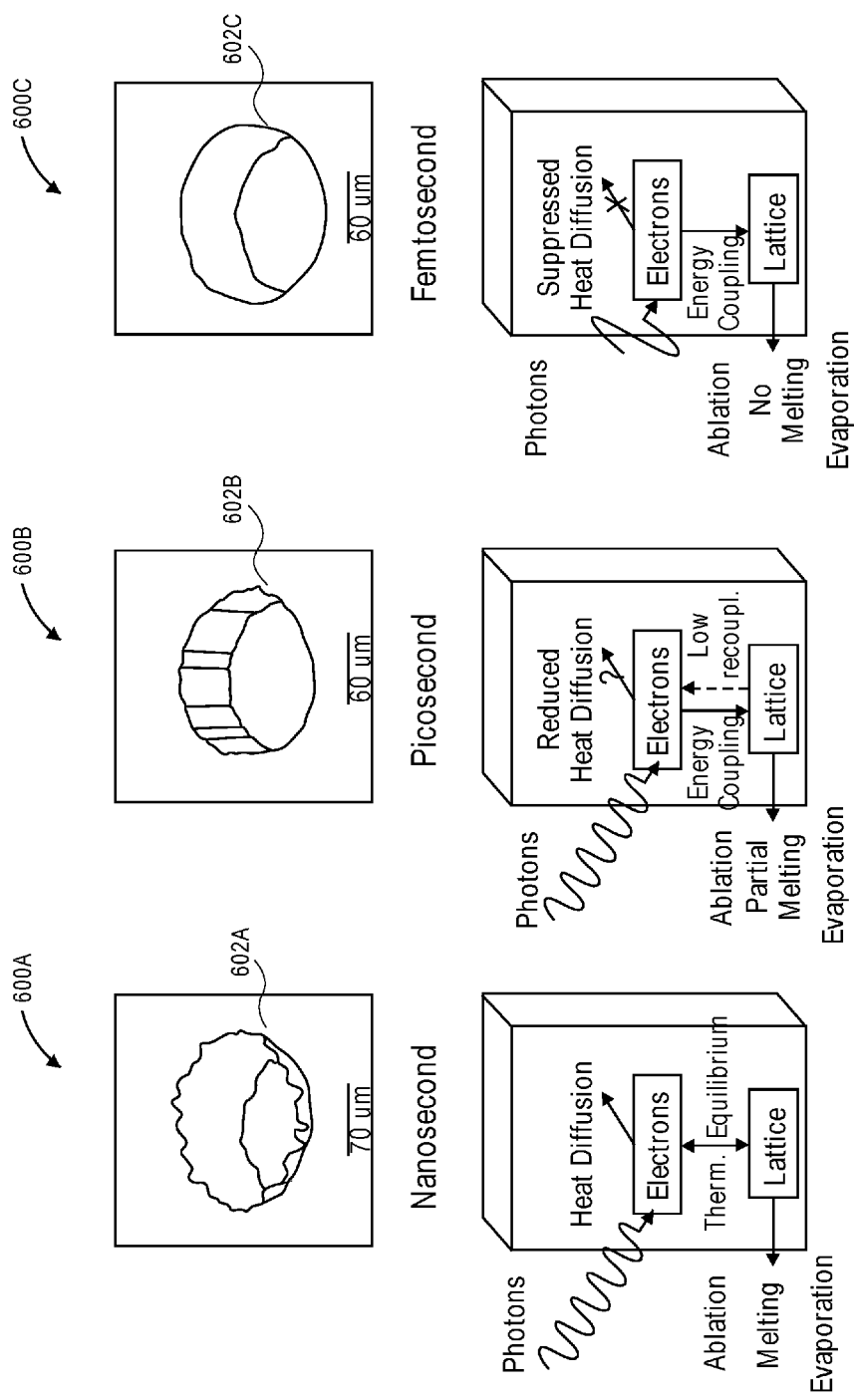
FIG. 6 illustrates the effects of using a laser pulse width in the femtosecond range, picoseconds range, and nanosecond range, in accordance with an embodiment of the present invention.

FIG. 6 illustrates the effects of using a laser pulse width in the femtosecond range, picosecond range, and nanosecond range, in accordance with an embodiment of the present invention. Referring to FIG. 6, by using a laser beam in the femtosecond range, heat damage issues are mitigated or eliminated (e.g., minimal to no damage 602C with femtosecond processing of a via 600C) versus longer pulse widths (e.g., significant damage 602A with nanosecond processing of a via 600A). The elimination or mitigation of damage during formation of via 600C may be due to a lack of low energy recoupling (as is seen for picosecond-based laser ablation of 600B/602B) or thermal equilibrium (as is seen for nanosecond-based laser ablation), as depicted in FIG. 6.

Laser parameters selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 7 illustrates a cross-sectional view of a stack of materials that may be used in a street region of a semiconductor wafer or substrate, in accordance with an embodiment of the present invention.

Figure 7:
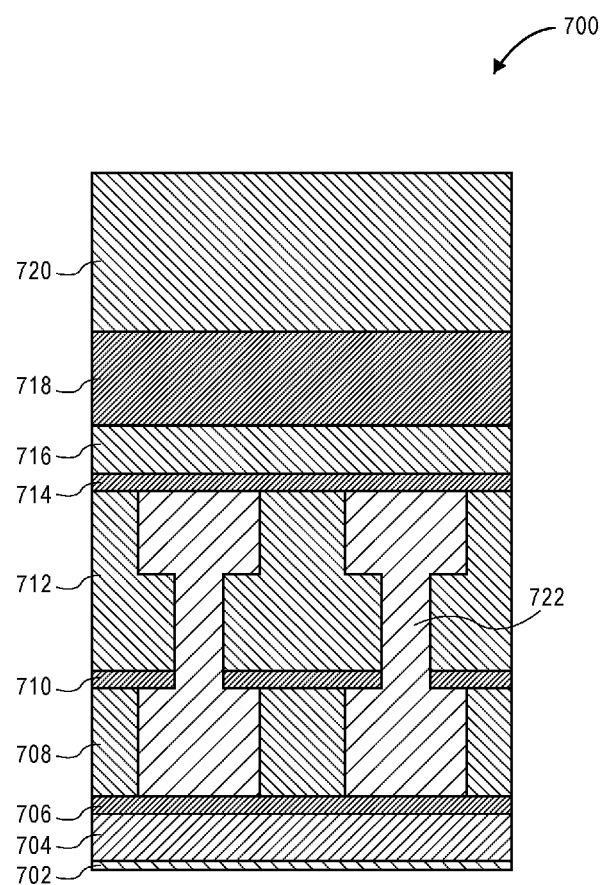
FIG. 7 illustrates a cross-sectional view of a stack of materials that may be used in a street region of a semiconductor wafer or substrate, in accordance with an embodiment of the present invention.

Referring to FIG. 7, a street region 700 includes the top portion 702 of a silicon substrate, a first silicon dioxide layer 704, a first etch stop layer 706, a first low K dielectric layer 708 (e.g., having a dielectric constant of less than the dielectric constant of 4.0 for silicon dioxide), a second etch stop layer 710, a second low K dielectric layer 712, a third etch stop layer 714, an undoped silica glass (USG) layer 716, a second silicon dioxide layer 718, and a layer of photoresist 720, with relative thicknesses depicted. Copper metallization 722 is disposed between the first and third etch stop layers 706 and 714 and through the second etch stop layer 710. In a specific embodiment, the first, second and third etch stop layers 706, 710 and 714 are composed of silicon nitride, while low K dielectric layers 708 and 712 are composed of a carbon-doped silicon oxide material.

Under conventional laser irradiation (such as nanosecond-based irradiation), the materials of street 700 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based irradiation. In an embodiment, a line shaped profile laser beam laser scribing process is used to pattern a layer of silicon dioxide, a layer of low K material, and a layer of copper by ablating the layer of silicon dioxide prior to ablating the layer of low K material and the layer of copper.

In case that the rotating laser beam or rotating shaped laser beam is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. In an embodiment, a line shaped profile laser beam laser scribing process is suitable to provide such advantages.

It is to be appreciated that the dicing or singulation process could be stopped after the above described laser scribing in a case that the laser scribing is used to pattern the mask as well as to scribe fully through the wafer or substrate in order to singulate the dies. Accordingly, further singulation processing would not be required in such a case. However, the following embodiments may be considered in cases where laser scribing alone is not implemented for total singulation.

Referring now to optional operation 106 of Flowchart 100, an intermediate post mask-opening cleaning operation is performed. In an embodiment, the post mask-opening cleaning operation is a plasma-based cleaning process. In a first example, as described below, the plasma-based cleaning process is reactive to the regions of the substrate 204 exposed by the gaps 210. In the case of a reactive plasma-based cleaning process, the cleaning process itself may form or extend trenches 212 in the substrate 204 since the reactive plasma-based cleaning operation is at least somewhat of an etchant for the substrate 204. In a second, different, example, as is also described below, the plasma-based cleaning process is non-reactive to the regions of the substrate 204 exposed by the gaps 210.

In accordance with a first embodiment, the plasma-based cleaning process is reactive to exposed regions of the substrate 204 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases $Ar+SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist or plasma-deposited Teflon masks 202, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the substrate 204 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks or for thinner plasma-deposited Teflon 202. In another such embodiment, separate mask condensation and scribed trench cleaning operations are used, e.g., an Ar or non-reactive gas (or the mix) highly-biased plasma treatment for mask condensation is first performed, and then an $Ar+SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) $Ar+SF_6$ highly-biased plasma cleaning of laser scribed trenches, and (c) Ar or non-reactive gas (or the mix) highly-biased plasma treatment for mask condensation. In accordance with another embodiment of the present invention, a plasma cleaning operation involves first use of a reactive plasma cleaning treatment, such as described above in the first aspect of operation 106. The reactive plasma cleaning treatment is then followed by a non-reactive plasma cleaning treatment such as described in association with the second aspect of operation 106.

Referring to operation 108 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the rotating laser beam or rotating shaped laser beam laser scribing process.

In an embodiment, patterning the mask with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In accordance with an embodiment of the present invention, the resulting roughness of mask opening from laser scribing can impact die sidewall quality resulting from the subsequent formation of a plasma etched trench. Lithographically opened masks often have smooth profiles, leading to smooth corresponding sidewalls of a plasma etched trench. By contrast, a conventional laser opened mask can have a very rough profile along a scribing direction if improper laser process parameters are selected (such as spot overlap, leading to rough sidewall of plasma etched trench horizontally). Although the surface roughness can be smoothened by additional plasma processes, there is a cost and throughput hit to remedying such issues. Accordingly, embodiments described herein may be advantageous in providing a smoother scribing process from the laser scribing portion of the singulation process.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the mask layer 208 is removed after the singulation process, as depicted in FIG. 2C. In another embodiment, the plasma etching operation described in association with FIG. 2C employs a conventional Bosch-type dep/etch/dep process to etch through the substrate 204. Generally, a Bosch-type process consists of three sub-operations: deposition, a directional bombardment etch, and isotropic chemical etch which is run through many iterations (cycles) until silicon is etched through.

Accordingly, referring again to Flowchart 100 and FIGS. 2A-2C, wafer dicing may be preformed by initial ablation using a rotating laser beam or rotating shaped laser beam laser scribing process to ablate through a mask layer, through wafer streets (including metallization), and partially into a silicon substrate. Die singulation may then be completed by subsequent through-silicon deep plasma etching. A specific example of a materials stack for dicing is described below in association with FIGS. 8A-8D, in accordance with an embodiment of the present invention.

Figure 8A:
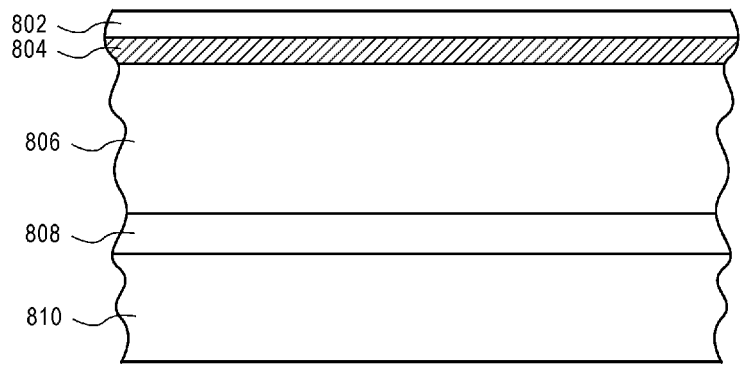
FIGS. 8A-8D illustrate cross-sectional views of various operations in a method of dicing a semiconductor wafer, in accordance with an embodiment of the present invention.

Referring to FIG. 8A, a materials stack for hybrid laser ablation and plasma etch dicing includes a mask layer 802, a device layer 804, and a substrate 806. The mask layer, device layer, and substrate are disposed above a die attach film 808 which is affixed to a backing tape 810. In an embodiment, the mask layer 802 is a water soluble layer such as the water soluble layers described above in association with mask 202. The device layer 804 includes an inorganic dielectric layer (such as silicon dioxide) disposed above one or more metal layers (such as copper layers) and one or more low K dielectric layers (such as carbon-doped oxide layers). The device layer 804 also includes streets arranged between integrated circuits, the streets including the same or similar layers to the integrated circuits. The substrate 806 is a bulk single-crystalline silicon substrate.

In an embodiment, the bulk single-crystalline silicon substrate 806 is thinned from the backside prior to being affixed to the die attach film 808. The thinning may be performed by a backside grind process. In one embodiment, the bulk single-crystalline silicon substrate 806 is thinned to a thickness approximately in the range of 50-100 microns. It is important to note that, in an embodiment, the thinning is performed prior to a laser ablation and plasma etch dicing process. In an embodiment, the photo-resist layer 802 has a thickness of approximately 5 microns and the device layer 804 has a thickness approximately in the range of 2-3 microns. In an embodiment, the die attach film 808 (or any suitable substitute capable of bonding a thinned or thin wafer or substrate to the backing tape 810) has a thickness of approximately 20 microns.

Figure 8B:
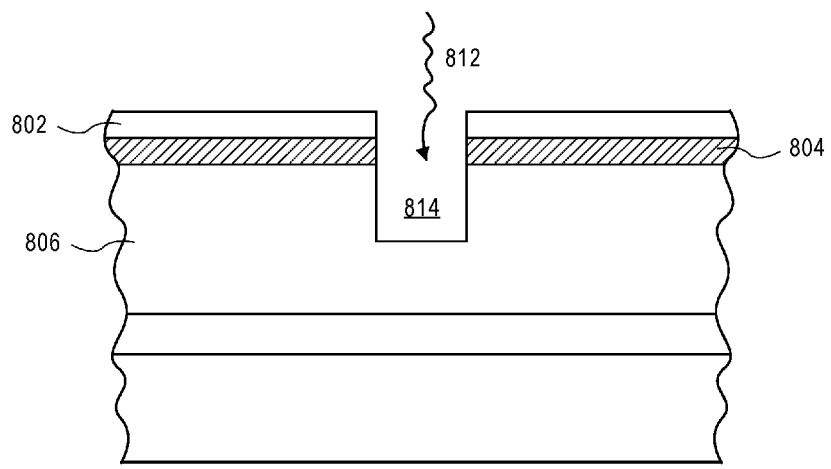
Figure 8C:
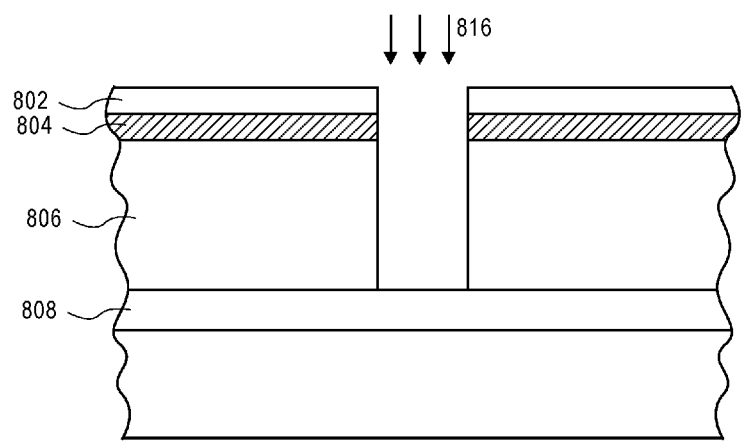

Referring to FIG. 8B, the mask 802, the device layer 804 and a portion of the substrate 806 are patterned with a rotating laser beam or rotating shaped laser beam laser scribing process 812 to form trenches 814 in the substrate 806. Referring to FIG. 8C, a through-silicon deep plasma etch process 816 is used to extend the trench 814 down to the die attach film 808, exposing the top portion of the die attach film 808 and singulating the silicon substrate 806. The device layer 804 is protected by the mask layer 802 during the through-silicon deep plasma etch process 816.

Figure 8D:
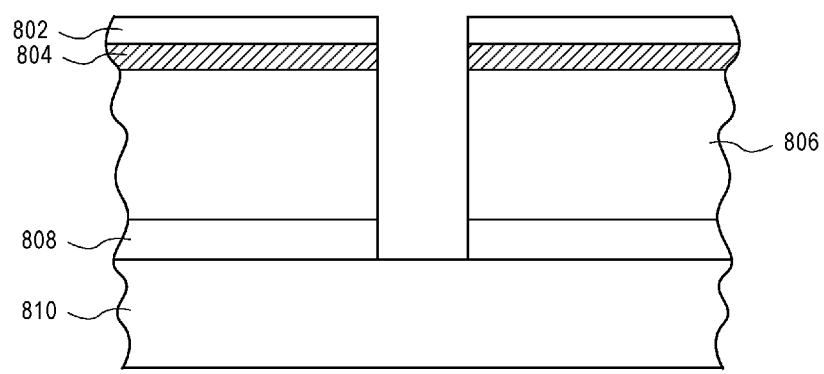

Referring to FIG. 8D, the singulation process may further include patterning the die attach film 808, exposing the top portion of the backing tape 810 and singulating the die attach film 808. In an embodiment, the die attach film is singulated by a laser process or by an etch process. Further embodiments may include subsequently removing the singulated portions of substrate 806 (e.g., as individual integrated circuits) from the backing tape 810. In one embodiment, the singulated die attach film 808 is retained on the back sides of the singulated portions of substrate 806. Other embodiments may include removing the mask layer 802 from the device layer 804. In an alternative embodiment, in the case that substrate 806 is thinner than approximately 50 microns, the rotating laser beam or rotating shaped laser beam laser scribing process 812 is used to completely singulate substrate 806 without the use of an additional plasma process.

A single process tool may be configured to perform many or all of the operations in a hybrid line shaped profile laser beam ablation and plasma etch singulation process. For example, FIG. 9 illustrates a block diagram of a tool layout for laser and plasma dicing of wafers or substrates, in accordance with an embodiment of the present invention.

Figure 9:
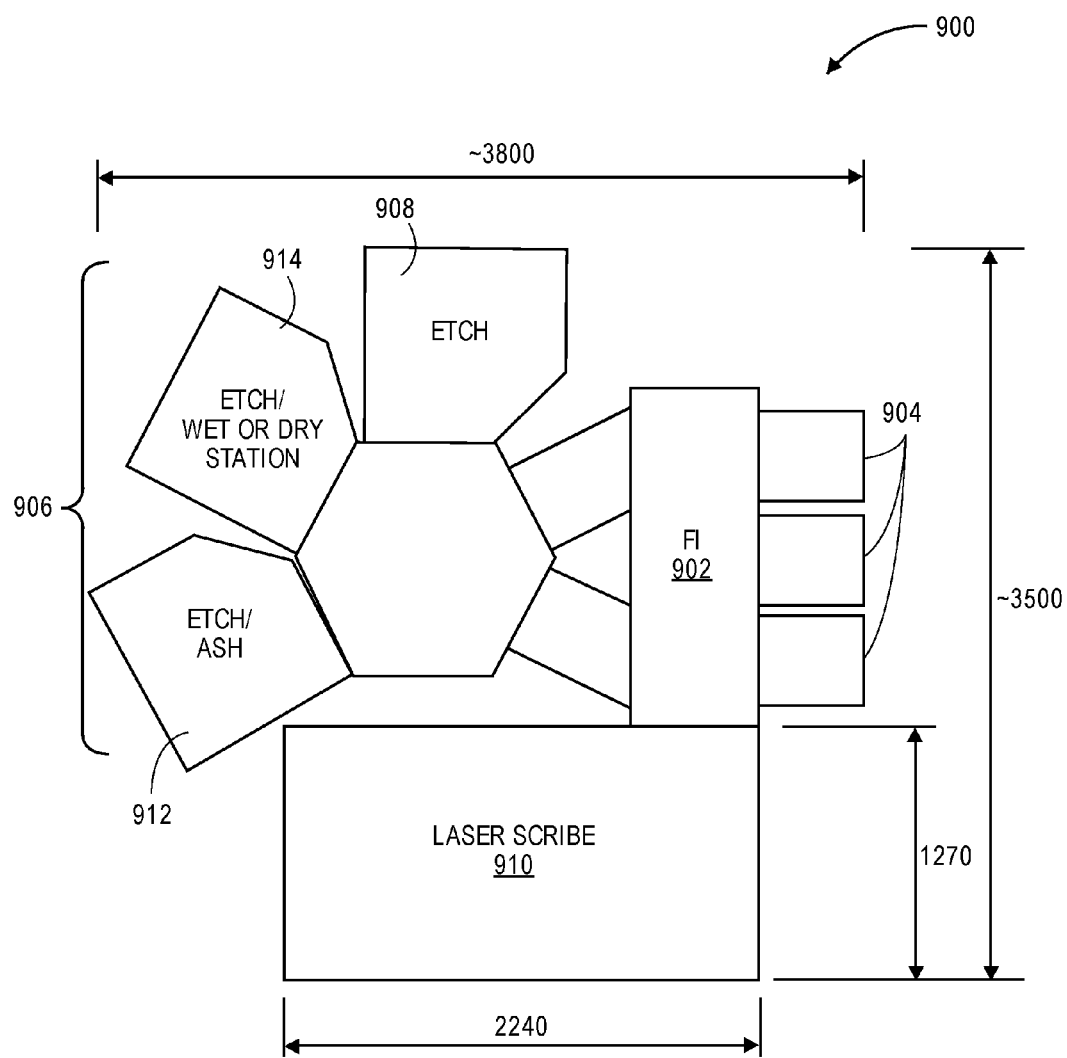
FIG. 9 illustrates a block diagram of a tool layout for laser and plasma dicing of wafers or substrates, in accordance with an embodiment of the present invention.

Referring to FIG. 9, a process tool 900 includes a factory interface 902 (FI) having a plurality of load locks 904 coupled therewith. A cluster tool 906 is coupled with the factory interface 902. The cluster tool 906 includes one or more plasma etch chambers, such as plasma etch chamber 908. A laser scribe apparatus 910 is also coupled to the factory interface 902. The overall footprint of the process tool 900 may be, in one embodiment, approximately 3500 millimeters (3.5 meters) by approximately 3800 millimeters (3.8 meters), as depicted in FIG. 9.

In an embodiment, the laser scribe apparatus 910 houses a laser assembly configured to provide a rotating laser beam. In one such embodiment, the laser assembly is configured to provide a rotating shaped laser beam. In a specific such embodiment, the laser assembly is configured to provide the rotating laser beam as a rotating shaped laser beam, the laser assembly including beam shaping optics selected from the group consisting of a diffractive optical element, one or more slit aperture, and axicons.

In an embodiment, the laser assembly is configured to rotate a laser beam around an on-axis of an input laser beam. In another embodiment, the laser assembly is configured to rotate a laser beam around an off-axis of an input laser beam. In either case, in a particular embodiment, the laser beam is a femto-second based laser beam.

In an embodiment, the laser assembly comprises a motor having a rotor with a core. The rotating laser beam is output from a tubular light pipe housed in the core of the rotor, an example of which is described above in association with FIG. 5A. In another embodiment, the laser assembly comprises a motor having a rotor with a core. The rotating laser beam is output from a cylindrical light pipe housed in the core of the rotor, an example of which is described above in association with FIG. 5B.

In an embodiment, the laser is suitable for performing a laser ablation portion of a hybrid laser and etch singulation process, such as the laser ablation processes described above. In one embodiment, a moveable stage is also included in laser scribe apparatus 910, the moveable stage configured for moving a wafer or substrate (or a carrier thereof) relative to the laser. In a specific embodiment, the laser is also moveable. The overall footprint of the laser scribe apparatus 910 may be, in one embodiment, approximately 2240 millimeters by approximately 1270 millimeters, as depicted in FIG. 9.

In an embodiment, the one or more plasma etch chambers 908 is configured for etching a wafer or substrate through the gaps in a patterned mask to singulate a plurality of integrated circuits. In one such embodiment, the one or more plasma etch chambers 908 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 908 to facilitate high silicon etch rates. In an embodiment, more than one etch chamber is included in the cluster tool 906 portion of process tool 900 to enable high manufacturing throughput of the singulation or dicing process.

The factory interface 902 may be a suitable atmospheric port to interface between an outside manufacturing facility with laser scribe apparatus 910 and cluster tool 906. The factory interface 902 may include robots with arms or blades for transferring wafers (or carriers thereof) from storage units (such as front opening unified pods) into either cluster tool 906 or laser scribe apparatus 910, or both.

Cluster tool 906 may include other chambers suitable for performing functions in a method of singulation. For example, in one embodiment, in place of an additional etch chamber, a deposition chamber 912 is included. The deposition chamber 912 may be configured for mask deposition on or above a device layer of a wafer or substrate prior to laser scribing of the wafer or substrate. In one such embodiment, the deposition chamber 912 is suitable for depositing a photo-resist layer. In another embodiment, in place of an additional etch chamber, a wet/dry station 914 is included. The wet/dry station may be suitable for cleaning residues and fragments, or for removing a mask, subsequent to a laser scribe and plasma etch singulation process of a substrate or wafer. In yet another embodiment, in place of an additional deep silicon etch chamber, a plasma etch chamber is included and is configured for performing a plasma-based cleaning process. In an embodiment, a metrology station is also included as a component of process tool 900.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 900 described in association with FIG. 9. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
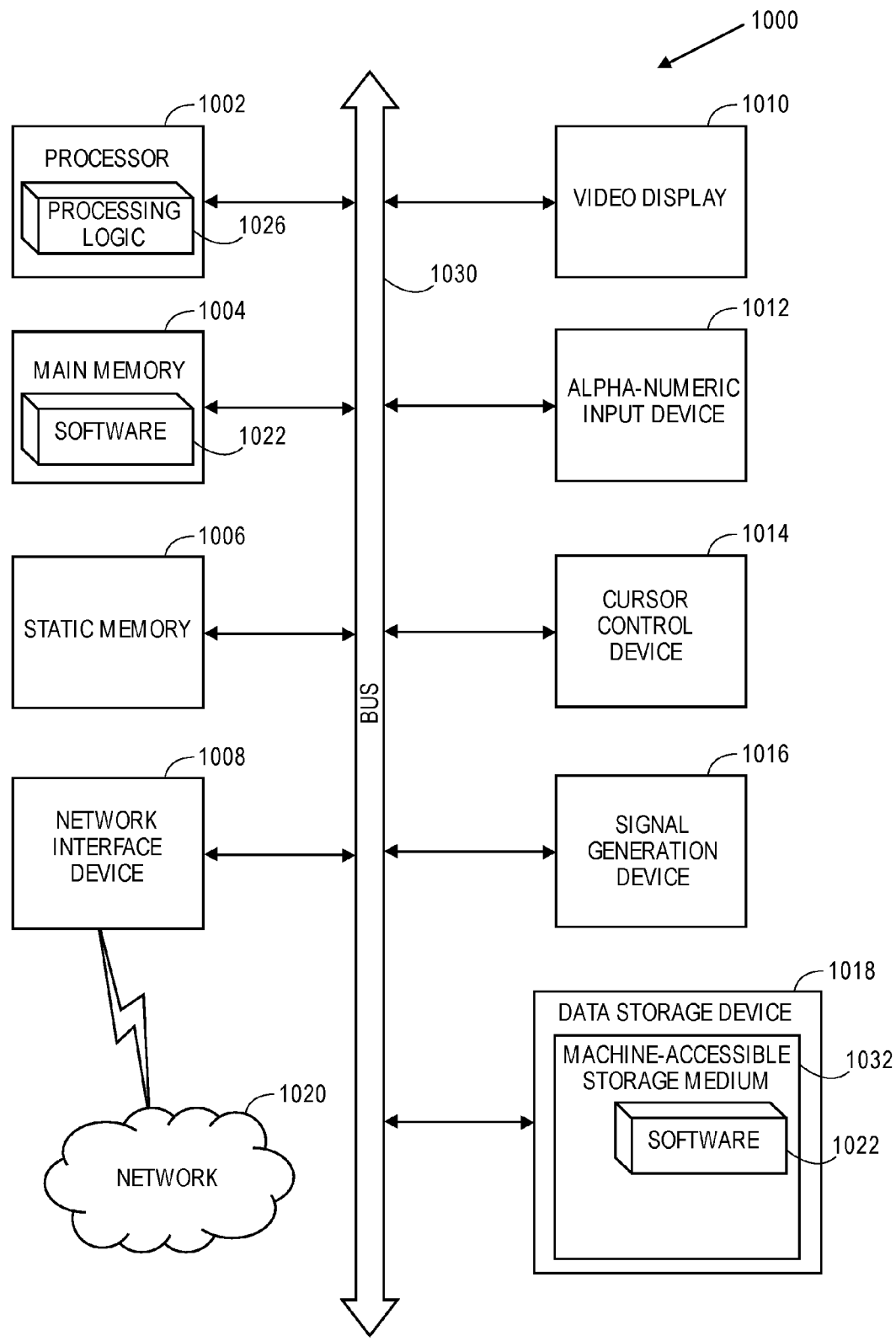
FIG. 10 illustrates a block diagram of an exemplary computer system, in accordance with an embodiment of the present invention.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), MRAM, etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets.

Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a rotating laser beam laser scribing process to provide a patterned mask with gaps, exposing regions of the semiconductor wafer between the integrated circuits. The semiconductor wafer is then plasma etched through the gaps in the patterned mask to singulate the integrated circuits.

Thus, hybrid wafer dicing approaches using a rotating laser beam or rotating shaped laser beam, and plasma etch process, have been disclosed.

What is claimed is:

1. A method of dicing a semiconductor wafer comprising a plurality of integrated circuits, the method comprising:
   forming a mask above the semiconductor wafer, the mask comprising a layer covering and protecting the integrated circuits;
   patterning the mask with a rotating laser beam laser scribing process to provide a patterned mask with gaps, exposing regions of the semiconductor wafer between the integrated circuits, wherein the rotating laser beam laser scribing process comprises rotating a laser beam around a central axis of the laser beam along a direction of travel of the laser beam; and
   plasma etching the semiconductor wafer through the gaps in the patterned mask to singulate the integrated circuits.

2. The method of claim 1, wherein the rotating laser beam laser scribing process is a rotating shaped laser beam laser scribing process.

3. The method of claim 1, wherein the rotating laser beam laser scribing process is based on a smooth Gaussian beam.

4. The method of claim 1, wherein the rotating laser beam laser scribing process is based on a smooth line-shaped beam having a flat top.

5. The method of claim 1, wherein scribing with the rotating laser beam laser scribing process comprises scribing with a rotating femto-second based laser beam.

6. The method of claim 1, wherein patterning the mask with the laser scribing process comprises forming trenches in the regions of the semiconductor wafer between the integrated circuits, and wherein plasma etching the semiconductor wafer comprises extending the trenches to form corresponding trench extensions.

7. A method of dicing a semiconductor wafer comprising a plurality of integrated circuits, the method comprising:
   providing a semiconductor wafer having a mask thereon, the mask comprising a layer covering and protecting the integrated circuits;
   patterning the mask with a rotating laser beam laser scribing process to provide a patterned mask with gaps, exposing regions of the semiconductor wafer between the integrated circuits, wherein the rotating laser beam laser scribing process comprises rotating a laser beam around a central axis of the laser beam along a direction of travel of the laser beam; and
   plasma etching the semiconductor wafer through the gaps in the patterned mask to singulate the integrated circuits.

8. The method of claim 7, wherein the rotating laser beam laser scribing process is a rotating shaped laser beam laser scribing process.

9. The method of claim 7, wherein the rotating laser beam laser scribing process is based on a smooth Gaussian beam.

10. The method of claim 7, wherein the rotating laser beam laser scribing process is based on a smooth line-shaped beam having a flat top.

11. The method of claim 7, wherein scribing with the rotating laser beam laser scribing process comprises scribing with a rotating femto-second based laser beam.

12. The method of claim 7, wherein patterning the mask with the laser scribing process comprises forming trenches in the regions of the semiconductor wafer between the integrated circuits, and wherein plasma etching the semiconductor wafer comprises extending the trenches to form corresponding trench extensions.

* * * * *